(12) United States Patent
Liu et al.

(10) Patent No.: US 10,333,042 B1
(45) Date of Patent: Jun. 25, 2019

(54) PACKAGE STRUCTURE FOR DISPLAY

(71) Applicant: UNIFLEX Technology Inc., Taichung (TW)

(72) Inventors: Yi-Chun Liu, New Taipei (TW); Meng-Huan Chia, Taichung (TW); Cheng-I Tu, Tainan (TW); Yuan-Chih Lee, Taoyuan (TW)

(73) Assignee: UNIFLEX Technology Inc., Taichung (TW)

( * ) Notice: Subject to any disclaimer, the term of this patent is extended or adjusted under 35 U.S.C. 154(b) by 0 days.

(21) Appl. No.: 16/040,549

(22) Filed: Jul. 20, 2018

(30) Foreign Application Priority Data

Mar. 30, 2018 (TW) .............................. 107111087 A

(51) Int. Cl.
| | |
|---|---|
| *H01L 33/62* | (2010.01) |
| *H01L 25/075* | (2006.01) |
| *H01L 23/14* | (2006.01) |
| *H01L 23/538* | (2006.01) |
| *H01L 23/00* | (2006.01) |

(Continued)

(52) U.S. Cl.
CPC .............. *H01L 33/62* (2013.01); *B32B 15/08* (2013.01); *B32B 15/20* (2013.01); *B32B 27/281* (2013.01); *H01L 23/145* (2013.01); *H01L 23/5384* (2013.01); *H01L 23/5387* (2013.01); *H01L 24/16* (2013.01); *H01L 25/0753* (2013.01); *H01L 33/647* (2013.01);

(Continued)

(58) Field of Classification Search
CPC .......................... H01L 33/06; H01L 23/49827
See application file for complete search history.

(56) References Cited

U.S. PATENT DOCUMENTS

2009/0252950 A1\* 10/2009 Liaw ...................... H01L 23/15
428/319.1
2013/0213697 A1\* 8/2013 Palaniswamy ........ H01L 33/486
174/254

(Continued)

FOREIGN PATENT DOCUMENTS

| TW | 201140525 | 11/2011 |
|---|---|---|
| TW | M441133 | 11/2012 |
| TW | 201724060 | 7/2017 |

OTHER PUBLICATIONS

"Office Action of Taiwan Counterpart Application", dated Oct. 17, 2018, p. 1-p. 7.

*Primary Examiner* — Thao P Le
(74) *Attorney, Agent, or Firm* — JCIPRNET

(57) ABSTRACT

A package structure for a display includes a flexible base film, a plurality of pads, a light-emitting component array, and a patterned circuit layer. The flexible base film includes a plurality of conductive vias, a first surface, and a second surface opposite to the first surface. The conductive vias connect the first surface and the second surface. A material of the flexible base film includes polyimide and black fillings. The pads are disposed on the first surface. The conductive vias are connected to the pads. The light-emitting component array includes a plurality of light-emitting component sets disposed on the pads and electrically connected to the pads. Each light-emitting component set includes a plurality of light-emitting components having different colors. The patterned circuit layer is disposed on the second surface and electrically connected to the conductive vias.

11 Claims, 4 Drawing Sheets

(51) Int. Cl.
   *B32B 15/08*      (2006.01)
   *B32B 15/20*      (2006.01)
   *B32B 27/28*      (2006.01)
   *H01L 33/64*      (2010.01)

(52) U.S. Cl.
   CPC . *B32B 2457/20* (2013.01); *H01L 2224/16227* (2013.01); *H01L 2924/12041* (2013.01)

(56) References Cited

U.S. PATENT DOCUMENTS

| | | | |
|---|---|---|---|
| 2013/0320390 A1* | 12/2013 | Palaniswamy | H01L 23/49872 257/99 |
| 2015/0380618 A1* | 12/2015 | Huang | H01L 33/62 257/88 |

\* cited by examiner

PACKAGE STRUCTURE FOR DISPLAY

CROSS-REFERENCE TO RELATED APPLICATION

This application claims the priority benefit of Taiwan application serial no. 107111087, filed on Mar. 30, 2018. The entirety of the above-mentioned patent application is hereby incorporated by reference herein and made a part of this specification.

BACKGROUND OF THE DISCLOSURE

1. Field of the Invention

The disclosure relates to a package structure, and particularly relates to a package structure for a display.

2. Description of Related Art

As smart electronic apparatuses become much thinner and internal circuits are designed to be much denser, adopting a reliable heat dissipation design inside an electronic apparatus has become the basic requirement to ensure smooth operation of an apparatus. Currently, an artificial graphite film prepared from a polyimide film exhibits a thinner thickness, a higher thermal conductivity, and is flexible and easy to process. Therefore, such artificial graphite film can satisfy the heat dissipation design requirement for a limited space inside the electronic apparatus, and such artificial graphite film has become an important heat dissipation material for a heat dissipation structure inside various smart mobile electronic apparatuses.

Besides, through the development of technologies in aeronautics, electronics, and batteries, people have more diversified and fine-grained demands on the properties of polyimide film materials for some specific occasions. Now, different polyimide film products showing characteristics different than previous polyimide films are already developed. For example, corona-resistant polyimide films, low-k polyimide films, transparent polyimide films, and the like have been developed. In some specific fields, the polyimide film needs to have characteristics of opacity, low light transmittance, and low reflection coefficient, and may have good light-shielding properties, thermal conductivity, etc., so as to be widely used in a display, a mobile device, a computer, and other electronic devices.

In order to achieve the above characteristics, it is known to coat a film layer containing black ink on one side or both sides of the polyimide film to thereby form a dual-layered polyimide film. While such process helps render a desired blackness in the polyimide film, the film-forming equipment is complex, process requirements are higher, and popularization is difficult. Also, additionally forming the black film layer may increase the manufacturing cost and bring an undesired effect on film properties, and thus the dual-layered polyimide film may easily deteriorate or discolor when being exposed to a high-temperature environment.

SUMMARY OF THE INVENTION

The disclosure provides a package structure for a display, wherein a flexible base film has a low reflectivity and a low manufacturing cost, and does not easily deteriorate or discolor.

The disclosure provides a package structure for a display including a flexible base film, a plurality of pads, a light-emitting component array, and a patterned circuit layer. The flexible base film includes a plurality of conductive vias, a first surface, and a second surface opposite to the first surface. The conductive vias connect the first surface and the second surface. A material of the flexible base film includes polyimide and black fillings. The pads are disposed on the first surface. The conductive vias are connected to the pads. The light-emitting component array includes a plurality of light-emitting component sets disposed on the pads and electrically connected to the pads. Each light-emitting component set includes a plurality of light-emitting components having different colors. The patterned circuit layer is disposed on the second surface and electrically connected to the conductive vias.

According to an embodiment of the disclosure, a color of the flexible base film is black.

According to an embodiment of the disclosure, a reflectivity of the flexible base film is lower than a reflectivity of polyimide.

According to an embodiment of the disclosure, a reflectivity of the flexible base film is lower than 10%.

According to an embodiment of the disclosure, the light-emitting component set includes a first light-emitting component with a color of emitted light in shades of red, a second light-emitting component with a color of emitted light in shades of green, and a third light-emitting component with a color of emitted light in shades of blue respectively disposed on the pads.

According to an embodiment of the disclosure, the light-emitting component set further includes a fourth light-emitting component with a color of emitted light in shades of white disposed on the pads.

According to an embodiment of the disclosure, a diameter of each of the conductive vias is substantially from 10 μm to 50 μm.

According to an embodiment of the disclosure, a thickness of the flexible base film is substantially from 10 μm to 30 μm.

According to an embodiment of the disclosure, the package structure for the display further includes a coverlay disposed on the second surface and covering the patterned circuit layer.

According to an embodiment of the disclosure, the conductive vias include a plurality of electrically conductive vias and a plurality of thermally conductive vias, and one of the electrically conductive vias and one of the thermally conductive vias are both connected to one of the pads.

According to an embodiment of the disclosure, the pads are physically isolated from each other on the first surface.

Based on the above, the flexible base film is mixed with the black fillings and the light-emitting component is disposed on the black (or a dark color with brightness very close to black) flexible base film mixed with the black fillings in the package structure for the display of the disclosure. Thus, the flexible base film may have characteristics of opacity, low light transmittance, and a low reflectivity, and may have good light-shielding properties, thermal conductivity, etc. Also, the flexible base film of the disclosure may prevent the problems that the conventional black coating cracks easily and may be easily separated from yellow polyimide. Moreover, the flexible base film mixed with the black fillings of the embodiment of the disclosure may be high heat resistant and does not discolor or crack easily. Thus, the flexible base film meets the requirements of high-temperature resistance when the light-emitting component is applied to the display, and the quality and stability of the package structure can be significantly improved.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
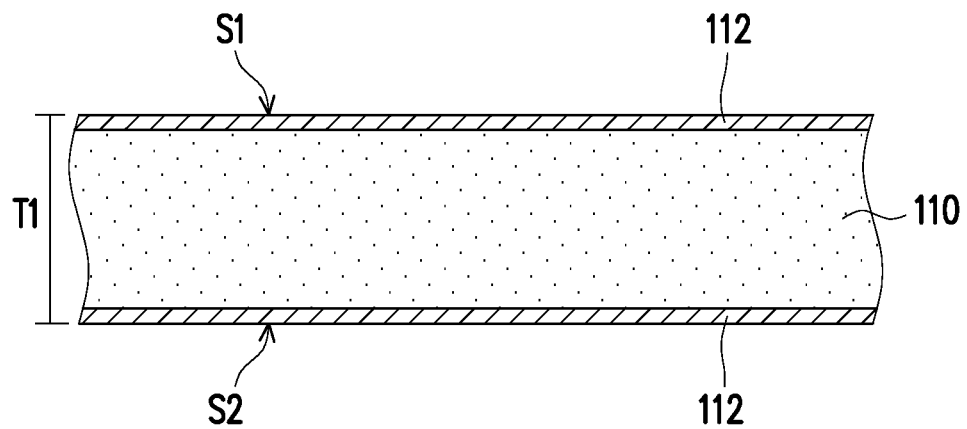
FIG. 1 to FIG. 5 are schematic cross-sectional views illustrating a manufacturing process of a package structure for a display according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

It is to be understood that both the foregoing and other detailed descriptions, features, and advantages are intended to be described more comprehensively by providing embodiments accompanied with figures hereinafter. In the following embodiments, wordings used to indicate directions, such as "up," "down," "front," "back," "left," and "right", merely refer to directions in the accompanying drawings. Therefore, the directional wording is used for an illustrative purpose and shall not be construed as a limitation on the disclosure. Meanwhile, in the following embodiments, like or similar elements are referred to with like or similar reference symbols.

FIG. 1 to FIG. 5 are schematic cross-sectional views illustrating a manufacturing process of a package structure for a display according to an embodiment of the disclosure. A package structure 100 of the embodiment is suitable for a display, such as a polymer light-emitting diode (PLED) display, an organic light-emitting diode (OLED) display, a liquid-crystal display (LCD), or other pixel-based displays, but the disclosure is not limited thereto. A manufacturing method of the package structure 100 of the embodiment includes the following structures. First, referring to FIG. 1, a flexible base film 110 is provided. The flexible base film 110 includes a first surface S1 and a second surface S2 opposite to the first surface S1, and a material of the flexible base film 110 includes polyimide (PI) and black fillings. In other words, the flexible base film 110 of the embodiment may include polyimide as a base, and may be formed by mixing polyimide with the black fillings. Accordingly, the color of the flexible base film 110 mixed with the black fillings is substantially black or in a dark color having a brightness very close to black.

Accordingly, in the embodiment, a reflectivity of the flexible base film 110 may be substantially lower than a reflectivity of polyimide. In other words, the reflectivity of the flexible base film 110 mixed with the black fillings is substantially lower than the reflectivity of polyimide without mixing with the black fillings. For instance, the reflectivity of the flexible base film 110 may be at least lower than or equal to 10%. Thus, the flexible base film 110 mixed with the black fillings of the embodiment may have characteristics of opacity, low light transmittance, and a low reflection coefficient, and may have good light-shielding properties, thermal conductivity, etc. Nevertheless, the embodiment does not intend to limit the material of the flexible base film 110. In other embodiments, the flexible base film 110 may also be formed by mixing another flexible base material having flexibility with the black fillings.

In the embodiment, the flexible base film 110 may further include metal foil layers 112 respectively disposed on an upper surface and a lower surface of the flexible base film 110. In the embodiment, the metal foil layer 112 may be a copper foil, for example, and may be laminated onto the flexible base film 110. In other words, the flexible base film 110 may be a flexible copper clad laminate (FCCL) that is black or in a dark color with brightness very close to black. In the embodiment, a thickness T1 of the flexible base film 110 may be substantially from 10 μm to 30 μm.

Figure 2:
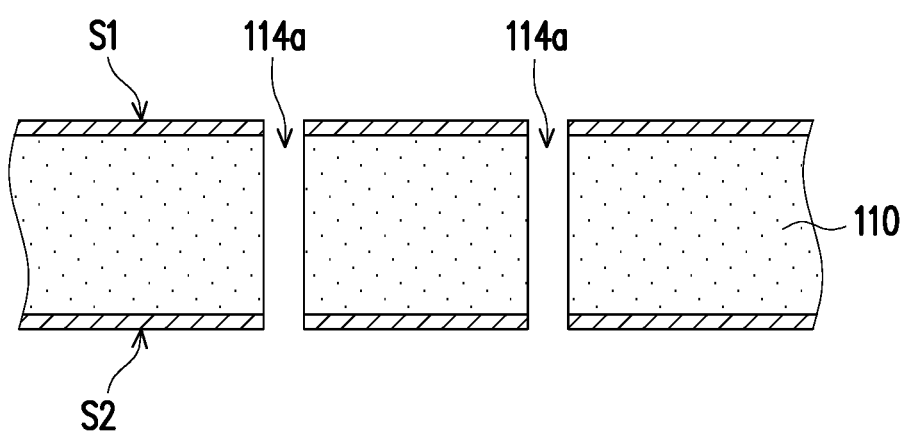

Then, referring to FIG. 2, a plurality of through holes 114a are formed on the flexible base film 110. The through holes 114a may penetrate through the flexible base film 110 to connect the first surface S1 and the second surface S2. In the embodiment, the through holes 114a may be formed by laser drilling, so as to form the through holes 114a having a smaller aperture size, thereby reducing a pitch between any two adjacent conductive vias 114 in the package structure 110. Accordingly, the package structure 100 can meet a fine pitch requirement. In the embodiment, a diameter of the through hole 114a formed by laser drilling is substantially from 10 μm to 50 μm. Alternatively, in other embodiments, the through holes 114a may also be formed by etching. In this way, a plurality of the through holes 114a can be formed quickly in batch production on the flexible base film 110. Therefore, the manufacturing efficiency can be effectively improved, and the production cost is reduced. The embodiment does not intend to limit the method of forming the through holes 114a.

Figure 3:
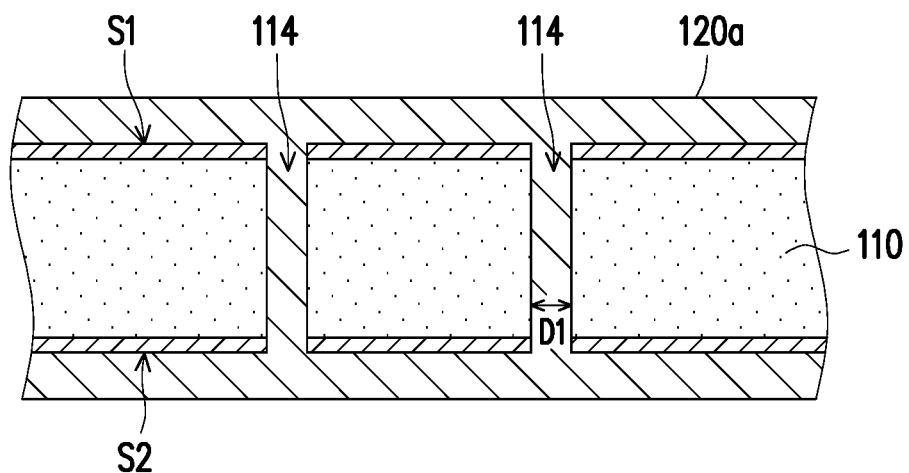

Then, referring to FIG. 3, a metal layer 120a is formed on the flexible base film 110, and the metal layer 120a covers inner walls of the through holes 114a. For instance, the method of forming the metal layer 120a may include the following steps. First, a chemical plating process is performed to form a seed layer (not shown) on the flexible base film 110. The seed layer may completely cover the first surface S1 and the second surface S2 of the flexible base film 110 and the inner walls of the through holes 114a. The chemical plating process is an auto-catalyzed reduction-oxidation reaction carried out by, for example, using a chemical copper plating solution during a chemical copper plating process, such that the metal ions are reduced to metal by gaining electrons. In the embodiment, a material of the seed layer may include copper, nickel, or other suitable materials.

Then, the aforementioned seed layer is used as an electrically conductive path to perform an electroplating process, so as to form the metal layer 120a on the flexible base film 110 as shown in the figure. In the embodiment, a material of the metal layer 120a may include copper or other suitable materials. In the embodiment, the metal layer 120a may completely fill the through holes 114a to form the conductive vias 114 connecting the first surface S1 and the second surface S2 as shown in FIG. 3. In the embodiment, a diameter D1 of the conductive via 114 is substantially from 10 μm to 50 μm.

Figure 4:
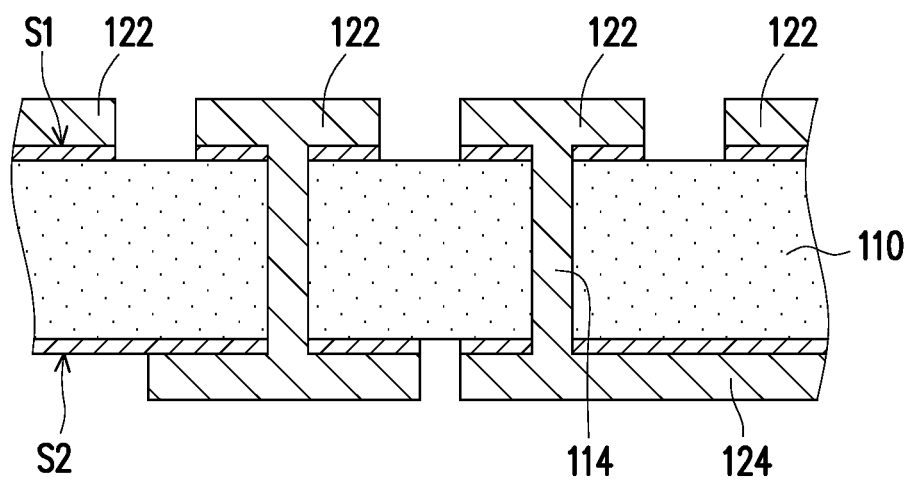

Then, referring to FIG. 4, a patterning process is performed on the metal layer 120a to form a patterned metal layer 120 as shown in FIG. 4. In the embodiment, the patterning process may include the following steps. First, a photoresist layer (not shown) may be formed on the metal layer 120a, for example, wherein the photoresist layer exposes a portion of the metal layer 120a. Then, a patterning process is performed on the metal layer 120a and the seed layer to remove the portion of the metal layer 120a and the seed layer exposed by the photoresist layer, so as to form the patterned metal layer 120 as shown in FIG. 4. Nevertheless, a wiring process as described above is merely provided as an example. The embodiment does not intend to limit the method of forming the patterned metal layer 120. Other than manufactured by a semi-additive process, the patterned metal layer 120 may also be manufactured by an additive process, a subtractive process, or other processes people having ordinary skills in the art are known of.

Referring to FIG. 4, in the embodiment, the patterned metal layer 120 includes a plurality of pads 122 and a patterned circuit layer 124. The pads 122 are disposed on the first surface S1. Also, in the embodiment, the conductive vias 114 may be respectively disposed directly below the pads 122 to be respectively connected to the pads 122. The patterned circuit layer 124 is disposed on the second surface S2 and electrically connected to the conductive vias 114. In the embodiment, the pads 112 are physically isolated from each other on the first surface S1. In other words, there is no other wiring connecting between the pads 122 on the first surface S1, and the pads 122 are disposed on the first surface S1 in a manner of isolated islands. The pads 122 may be electrically conductive to the second surface S2 via the conductive vias 114 and electrically connected to each other via the patterned circuit layer 124. With such a structure configuration, the first surface S1 of the flexible base film 110 does not have any wiring except for the pads 112 thereon. All the wiring is disposed on the second surface S2 of the flexible base film 110 and electrically connected to the pads 122 via the conductive vias 114. Therefore, a wiring space is saved from the first surface S1, the pitch between the pads 122 may be further reduced, and a density of the pads 122 may be increased. Thereby, a density of components disposed on the pads 122 may be increased. Moreover, the first surface S1 of the flexible base film 110 does not have any wiring except for the pads 112 thereon, and the flexible base film 110 is mixed with the black fillings. Thus, on the first surface S1 of the flexible base film 110, there is no need to attach a coverlay or ink whose color is black or a dark color with brightness very close to black to cover and protect the wiring on the first surface S1. Accordingly, an overall thickness of the package structure 100 of the embodiment can be effectively reduced (may be reduced by about 25 μm to 50 μm).

Figure 5:
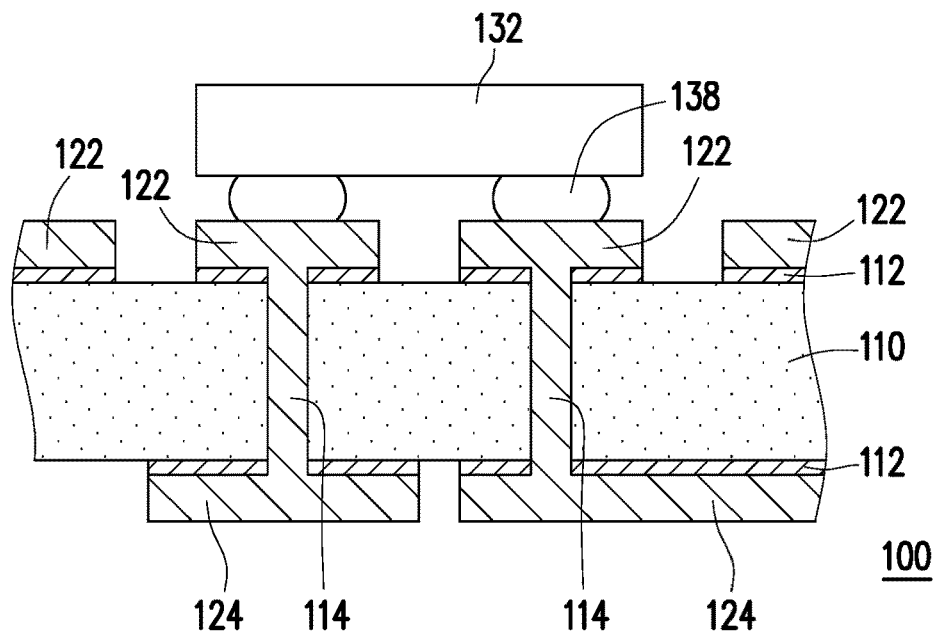
Figure 6:
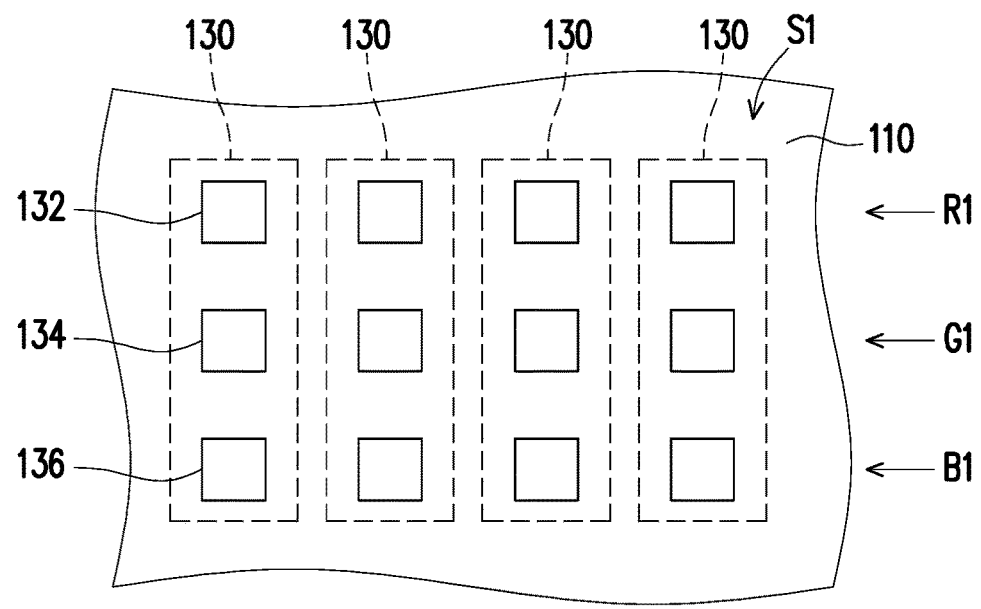
FIG. 6 is a schematic top view illustrating a flexible base film of a package structure for a display according to an embodiment of the disclosure.

FIG. 6 is a schematic top view illustrating a flexible base film of a package structure for a display according to an embodiment of the disclosure. Then, referring to FIG. 5 and FIG. 6, a light-emitting component array is disposed on the first surface S1 as shown in FIG. 6. The light-emitting component array includes a plurality of light-emitting component sets 130, and each of the light-emitting component sets 130 may further include a plurality of light-emitting components, of which the colors of the emitted lights are different from each other. For instance, the light-emitting component set 130 may be a three primary color light-emitting component set 130. In other words, each of the light-emitting component sets 130 may include a first light-emitting component 132, a second light-emitting component 134, and a third light-emitting component 136. The colors of the lights emitted by the light-emitting components 132, 134, and 136 in the light-emitting component set 130 are different from each other, and are respectively three primary color (RGB) of light. The light-emitting components 132, 134, and 136 are disposed on the pad 122 adjacent to one another to jointly form a pixel in a display. For instance, the first light-emitting component may have a color of emitted light in shades of red, the second light-emitting component may have a color of emitted light in shades of green, and the third light-emitting component may have a color of emitted light in shades of blue. Nevertheless, the embodiment is not limited thereto. In other embodiments, each of the light-emitting component sets 130 may not merely include the light-emitting components 132, 134, and 136 having three primary colors, but also include a fourth light-emitting component having a color of emitted light in shades of white. The embodiment does not intend to limit the number, type, and color of the light-emitting components of the light-emitting component sets 130.

In the embodiment, the light-emitting components 132, 134, and 136 may be regarded as a sub-pixel in the light-emitting component array. Thereby, the sub-pixel light-emitting components (e.g. the light-emitting components 132, 134, and 136) having the same primary color are arranged in a strip manner to form a set of sub-pixel strip (a red pixel strip R1, a green pixel strip G1, and a blue pixel strip B1 as shown in FIG. 6) on the first surface S1 of the flexible base film 110. In general, the LED display usually has a large number of such sub-pixel strip sets. A brightness of each of the sub-pixels (e.g., the light-emitting components 132, 134, and 136) in the light-emitting component sets 130 may be controlled to form a display pixel with a perceivable desired color. Thus, the light-emitting components 132, 134, and 136 are disposed in an array on the plurality of pads 122 of the flexible base film 110, and the light-emitting components 132, 134, and 136 are electrically connected to the pads 122 to form an addressable display unit. It should be noted that, the cross-sectional views illustrating the manufacturing process as shown in FIG. 1 to FIG. 5 are merely an example of a partial cross-sectional view for the first light-emitting component 132, and people having ordinary skills in the art should understand that other light-emitting components (e.g. the light-emitting components 134 and 136) may be further disposed on the flexible base film 110.

In the embodiment, the light-emitting components 132, 134, and 136 may be mini LEDs or micro LEDs. In general, a mini LED means that a size of the light-emitting component 130 of the LED is about 100 microns. Nevertheless, the embodiment is merely for illustration and is not limited thereto. The light-emitting component 130 may be bonded to the pad 122 located on the first surface S1 of the flexible base film 110 by a flip chip bonding method via a plurality of solder balls 138, for example. In the embodiment, the plurality of light-emitting components 130 may be disposed in the form of an array on the first surface S1 of the flexible base film 110. Then, a coverlay 140 may be disposed on the second surface S2 of the flexible base film 110, and the coverlay 140 covers the patterned circuit layer 124 on the second surface S2 to protect the patterned circuit layer 124 from being affected by oxidation or external contamination. In the embodiment, the coverlay 140 may be optionally disposed, and the coverlay 140 may be a transparent coverlay or an opaque coverlay. In other embodiments, the coverlay may also be disposed on the first surface S1 of the flexible base film 110, and the coverlay covering the first surface S1 is a transparent coverlay. Accordingly, the method for manufacturing the package structure 100 for the display of the embodiment is substantially completed.

With such a structure configuration, the flexible base film 110 is mixed with the black fillings and the light-emitting component 130 is disposed on such black (or a dark color whose brightness is very close to black) flexible base film 110 mixed with the black fillings in the package structure 100 for the display of the embodiment. Thus, the flexible base film 110 mixed with the black fillings of the embodiment may have characteristics of opacity, low light transmittance, and a low reflectivity, and may have good light-shielding properties, thermal conductivity, etc. Also, compared with conventional technique of additionally coating a black coating on yellow polyimide (PI), the flexible base film 110 mixed with the black fillings of the embodiment may prevent the problems that the black coating cracks easily and is easily separated from the yellow polyimide, and may reduce the overall thickness (from about 10 μm to about 30 μm) of the flexible base film 110. Moreover, the flexible base film 110 mixed with the black fillings of the embodiment may be high heat resistant. Even after being exposed to a high temperature for thousands of hours, the flexible base film 110 of the embodiment does not discolor or crack easily. Thus, the flexible base film 110 meets the requirement of high-temperature stability when the package structure 100 is applied to the display to perform light emission for thousands of hours, and the quality and stability of the package structure 100 can be significantly improved.

In addition, the flexible base film 110 of the embodiment further has the flexible property, making it suitable to be adopted to an organic light-emitting diode (OLED), which is known for being flexible. Therefore, the flexible base film 110 of the embodiment may be applied to a flexible display. Additionally, in the embodiment, on the first surface S1, the pads 122 are electrically connected to the patterned circuit layer 124 of the second surface S2 via the conductive vias 114 and to be electrically connected to each other. Therefore, the wiring space may be saved from the first surface S1 of the flexible base film 110, the pitch between the pads 122 may be reduced, and the density of the pads 122 may be increased. Thereby, the component density of the light-emitting components 132, 134, and 136 disposed on the pads 122 may be increased, and the resolution of the display using the package structure 100 is improved. Thus, the package structure 100 of the embodiment can be applied to a high definition (HD) display of which the pitch requirement is finer. Also, the first surface S1 of the flexible base film 110 does not have any wiring except for the pads 112 thereon, and the flexible base film 110 is mixed with the black fillings. Thus, there is no need to attach a coverlay or ink whose color is black or a dark color with brightness very close to black to cover and protect the wiring on the first surface S1. Accordingly, the display using the package structure 100 of the embodiment can have thinner thickness (the thickness may be reduced by about 25 μm to 50 μm).

Figure 7:
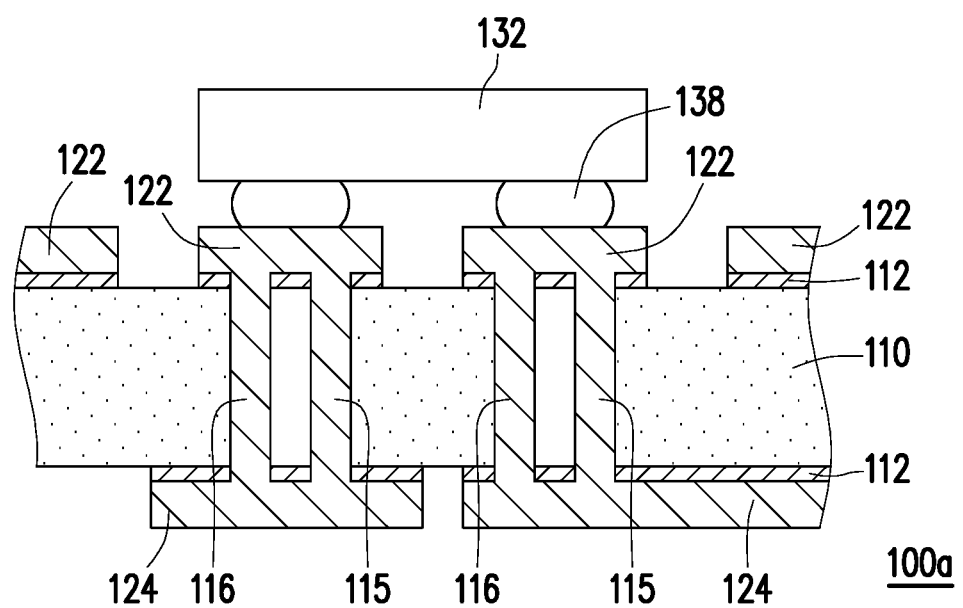
FIG. 7 is a schematic cross-sectional view illustrating a package structure for a display according to an embodiment of the disclosure.

FIG. 7 is a schematic cross-sectional view illustrating a package structure for a display according to an embodiment of the disclosure. It should be noted that, a package structure 100a of the embodiment is similar to the package structure 100 of FIG. 5. Therefore, the reference symbols and part of the contents of the previous embodiment are also used in the embodiment. In addition, like reference symbols are used to refer to like or similar components, and repeated technical contents are omitted. For a detailed description of the omitted parts, reference can be found in the previous embodiment, and no repeated description is contained in the following embodiment. Referring to FIG. 7, the following descriptions focus on the difference between the package structure 100a of the embodiment and the package structure 100 of FIG. 5.

Referring to FIG. 7, in the embodiment, the conductive vias 114 may include a plurality of electrically conductive vias 115 and a plurality of thermally conductive vias 116. In addition, one of the electrically conductive vias 115 and one of the thermally conductive via 116 are both connected to one of the pads 122. In other words, each of the pads 122 may be connected to one of the electrically conductive vias 115 and one of the thermally conductive vias 116 at the same time. The electrically conductive vias 115 may be electrically connected to the light-emitting component 130 via the pads 122, while the thermally conductive vias 116 may be thermally coupled to the pads 122, so that the heat generated by the light-emitting component 130 may be transmitted to the patterned circuit layer 124 of the second surface S2 to dissipate heat via a heat transmission path formed by the pads 122 and the thermally conductive vias 116. Moreover, in the embodiment, a heat dissipation sheet may be further attached to the second surface S2 of the package structure 100a to dissipate the heat transmitted to the second surface S2 to an external environment.

Nevertheless, the embodiment is only described herein for an illustrative purpose, and the embodiment does not intend to limit the heat dissipation method of the package structures 100 and 100a. In other embodiments, at least one of the conductive vias 114 connected to the light-emitting component 132 may serve as a thermally conductive via and be thermally coupled to the pad 122, while rest of the conductive vias 114 are electrically conductive vias and electrically connected to the light-emitting component 132. In other words, each of the pads 122 is still connected to one of the conductive vias 114 as shown in FIG. 5, but some of the pads 122 are connected to the thermally conductive vias to transmit heat, while some of the pads 122 are connected to the electrically conductive vias to transmit electricity. Alternatively, each of the conductive vias 114 may transmit heat as well as electricity at the same time. Under the circumstance, the light-emitting component 132 is electrically connected to the patterned circuit layer 124 of the second surface S2, and the heat generated by the light-emitting component 132 is transmitted to the patterned circuit layer 124 of the second surface S2 to dissipate heat.

In summary, the flexible base film is mixed with the black fillings and the light-emitting component is disposed on the black (or a dark color whose brightness is very close to black) flexible base film mixed with the black fillings in the package structure for the display of the disclosure. Thus, the flexible base film mixed with the black fillings of the embodiment in the disclosure may have characteristics of opacity, low light transmittance, and a low reflectivity, may have good light-shielding properties, thermal conductivity, etc., and is very suitable for the application of the display. In addition, the flexible base film of the disclosure may prevent the problems that the black coating cracks easily and is easily separated from the yellow polyimide, and may further reduce the thickness of the flexible base film. Therefore, the package structure of the embodiment has a higher yield rate and higher stability.

Additionally, in some embodiments, the pads are electrically conductive to the patterned circuit layer of the second surface via the conductive vias and to be electrically connected to each other. Therefore, the wiring space may be saved from the first surface of the flexible base film, the pitch between the pads may be reduced, and the component density of the light-emitting component disposed on the pads may be increased. Thereby, the resolution of the display using the package structure is improved. Also, the first surface of the flexible base film does not have any wiring except for the pads thereon, and the flexible base film is mixed with the black fillings. Thus, on the first surface of the flexible base film, there is no need to attach a black or dark color coverlay or ink to cover and protect the wiring on the first surface, so as to effectively reduce the overall thickness of the package structure 100. Thus, the package structure of the disclosure can be applied to a more compact display with finer pitch requirement.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A package structure for a display, comprising:
   a flexible base film, comprising a plurality of conductive vias, a first surface, and a second surface opposite to the first surface, the conductive vias connecting the first surface and the second surface, wherein a material of the flexible base film comprises polyimide and black fillings;
   a plurality of pads, disposed on the first surface, the conductive vias being connected to the pads;
   a light-emitting component array, comprising a plurality of light-emitting component sets disposed on the pads and electrically connected to the pads, wherein each of the light-emitting component sets comprises a plurality of light-emitting components having different colors; and
   a patterned circuit layer, disposed on the second surface and electrically connected to the conductive vias.

2. The package structure for the display according to claim 1, wherein a color of the flexible base film is black.

3. The package structure for the display according to claim 1, wherein a reflectivity of the flexible base film is lower than a reflectivity of polyimide.

4. The package structure for the display according to claim 1, wherein a reflectivity of the flexible base film is lower than 10%.

5. The package structure for the display according to claim 1, wherein each of the light-emitting component sets comprises a first light-emitting component with a color of emitted light in shades of red, a second light-emitting component with a color of emitted light in shades of green, and a third light-emitting component with a color of emitted light in shades of blue respectively disposed on the pads.

6. The package structure for the display according to claim 5, wherein each of the light-emitting component sets further comprises a fourth light-emitting component with a color of emitted light in shades of white disposed on the pads.

7. The package structure for the display according to claim 1, wherein a diameter of each of the conductive vias is substantially from 10 μm to 50 μm.

8. The package structure for the display according to claim 1, wherein a thickness of the flexible base film is substantially from 10 μm to 30 μm.

9. The package structure for the display according to claim 1, further comprising a coverlay disposed on the second surface and covering the patterned circuit layer.

10. The package structure for the display according to claim 1, wherein the conductive vias comprise a plurality of electrically conductive vias and a plurality of thermally conductive vias, and one of the electrically conductive vias and one of the thermally conductive vias are both connected to one of the pads.

11. The package structure for the display according to claim 1, wherein the pads are physically isolated from each other on the first surface.

* * * * *